(12) United States Patent
Fukiage

(10) Patent No.: US 6,773,762 B1
(45) Date of Patent: Aug. 10, 2004

(54) PLASMA TREATMENT METHOD

(75) Inventor: Noriaki Fukiage, Tama (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 09/573,418

(22) Filed: May 18, 2000

Related U.S. Application Data

(63) Continuation of application No. PCT/JP98/05131, filed on Nov. 13, 1998.

(30) Foreign Application Priority Data

Nov. 20, 1997 (JP) ............................................. 9-336294

(51) Int. Cl.$^7$ ......................... C23C 14/58; C23C 14/06; C23C 14/12; B05D 3/06; H01L 21/3105
(52) U.S. Cl. ....................... 427/534; 427/535; 427/534; 427/577; 438/780; 438/759
(58) Field of Search ................................ 427/577, 536, 427/535, 534, 524; 438/780, 781, 784, 798, 759; 216/67; 204/192.35, 192.36

(56) References Cited

U.S. PATENT DOCUMENTS

| | | | | |
|---|---|---|---|---|
| 5,198,263 A | * | 3/1993 | Stafford et al. | 427/577 |
| 5,804,259 A | * | 9/1998 | Robles | 427/577 |
| 5,900,290 A | * | 5/1999 | Yang et al. | 427/577 |
| 5,939,149 A | * | 8/1999 | Jang et al. | 427/535 |
| 6,033,979 A | * | 3/2000 | Endo | 438/778 |
| 6,048,786 A | * | 4/2000 | Kudo | 437/778 |
| 6,071,797 A | * | 6/2000 | Endo et al. | 427/577 |
| 2003/0153196 A1 | * | 8/2003 | Tzeng et al. | 438/724 |

FOREIGN PATENT DOCUMENTS

| | | | | |
|---|---|---|---|---|
| EP | 0 696 819 A1 | 6/1995 | ......... | H01L/23/532 |
| EP | 0701 283 A2 | 9/1995 | ......... | H01L/23/532 |
| EP | 0 794 569 A2 | 3/1997 | ......... | H01L/21/768 |
| EP | 0 933 802 A1 | 11/1997 | ....... | H01L/21/3065 |
| EP | 1 028 457 A1 | 10/1998 | ......... | H01L/21/314 |
| JP | 56098469 | 1/1980 | ........... | C23C/13/04 |
| JP | 03-139824 | 6/1991 | | |
| JP | 05234987 | 2/1992 | ......... | H01L/21/312 |
| JP | 6-333916 | 12/1994 | | |
| JP | 06-333916 | 12/1994 | | |
| JP | 8-64591 | 3/1996 | | |
| JP | 08-083842 | 3/1996 | | |
| JP | 8-222557 | 8/1996 | | |

OTHER PUBLICATIONS

G. Francz et al. "Photoelectron Spectroscopy of Ion–Irradiated B–Doped CVD Diamond Surfaces", Thin Solid Films, vol. 270, pp. 200–204, (1995) Apr.

Kazuhiko Endo and Toru Tatsumi, Preparation and Properties of Fluorinated Amorphous Carbon Thin Films By Plasma Enhanced Chemical Vapor Deposition, 1995, pp. 249–254 no month.

G. Francz, P. Reinke, P. Oelhafen, W. Hänni, Photoelectron spectroscopy of Ion–irradiated B–doped CVD diamond surfaces, 1995, pp. 200–204 no month.

* cited by examiner

*Primary Examiner*—Marianne Padgett
(74) *Attorney, Agent, or Firm*—Finnegan, Henderson, Farabow, Garrett & Dunner, L.L.P.

(57) ABSTRACT

In a case where a CF film is used as an interlayer dielectric film of a semiconductor device, when a wiring of tungsten is formed, the CF film is heated to a temperature of, e.g., about 400 to 450° C. At this time, F gases are desorbed from the CF film, so that there are various disadvantages due to the corrosion of the wiring and the decrease of film thickness. In order to prevent this, thermostability is enhanced.

A compound gas of C and F, e.g., $C_4F_8$ gas, and a hydrocarbon gas, e.g., $C_2H_4$ gas, are used as thin film deposition gases. These gases are activated as plasma to deposit a CF film on a semiconductor wafer 10 using active species thereof. Then, Ar gas serving as a sputtering gas is introduced to be activated as plasma, and the CF film deposited on the wafer 10 is sputtered with the Ar plasma. If the thin-film deposition process and the sputtering process are alternately repeated, weak bonds existing in the CF film are removed by sputtering. Therefore, the bonds are strengthen and difficult to be cut even at a high temperature, so that thermostability is improved.

13 Claims, 5 Drawing Sheets

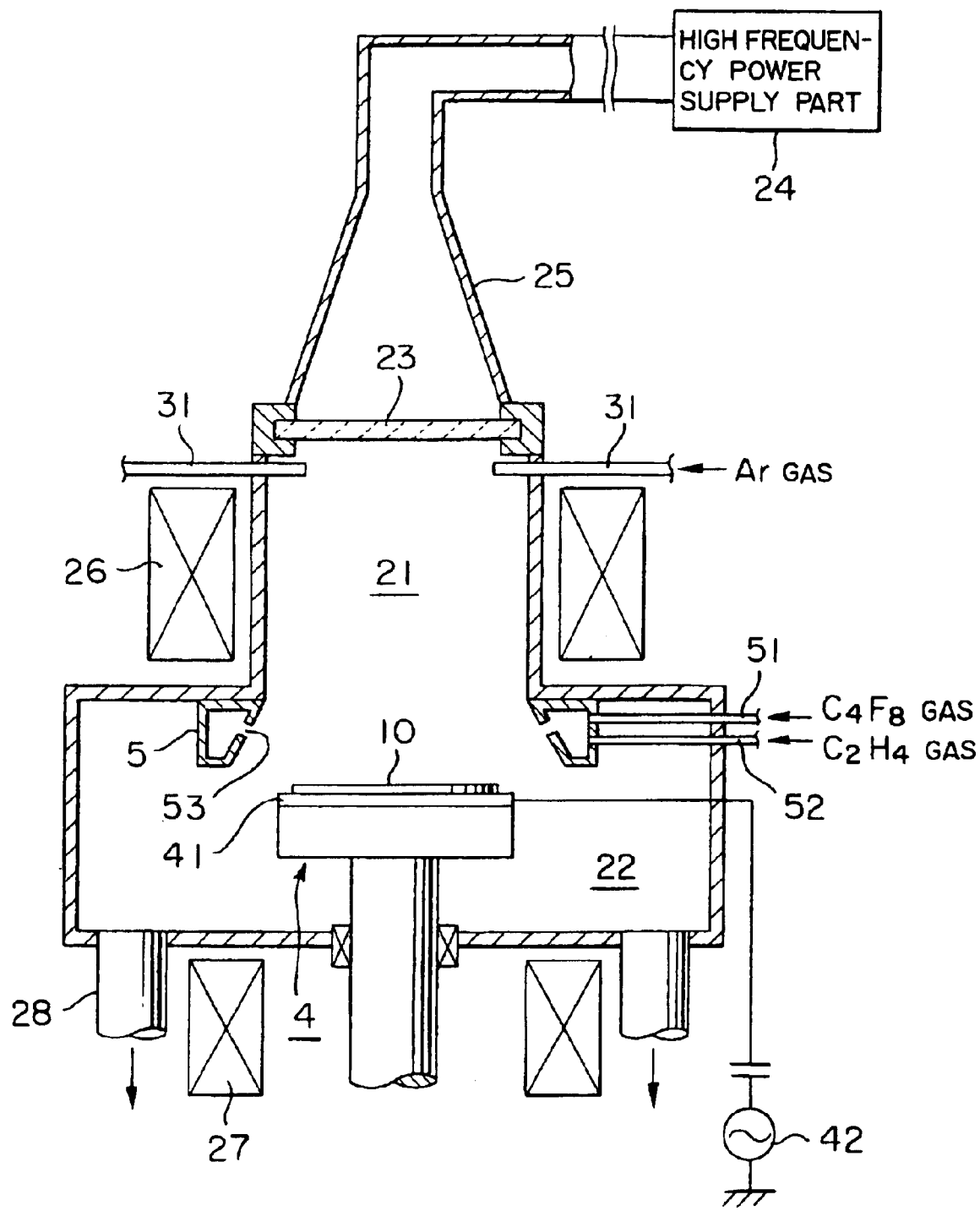
F I G. 1

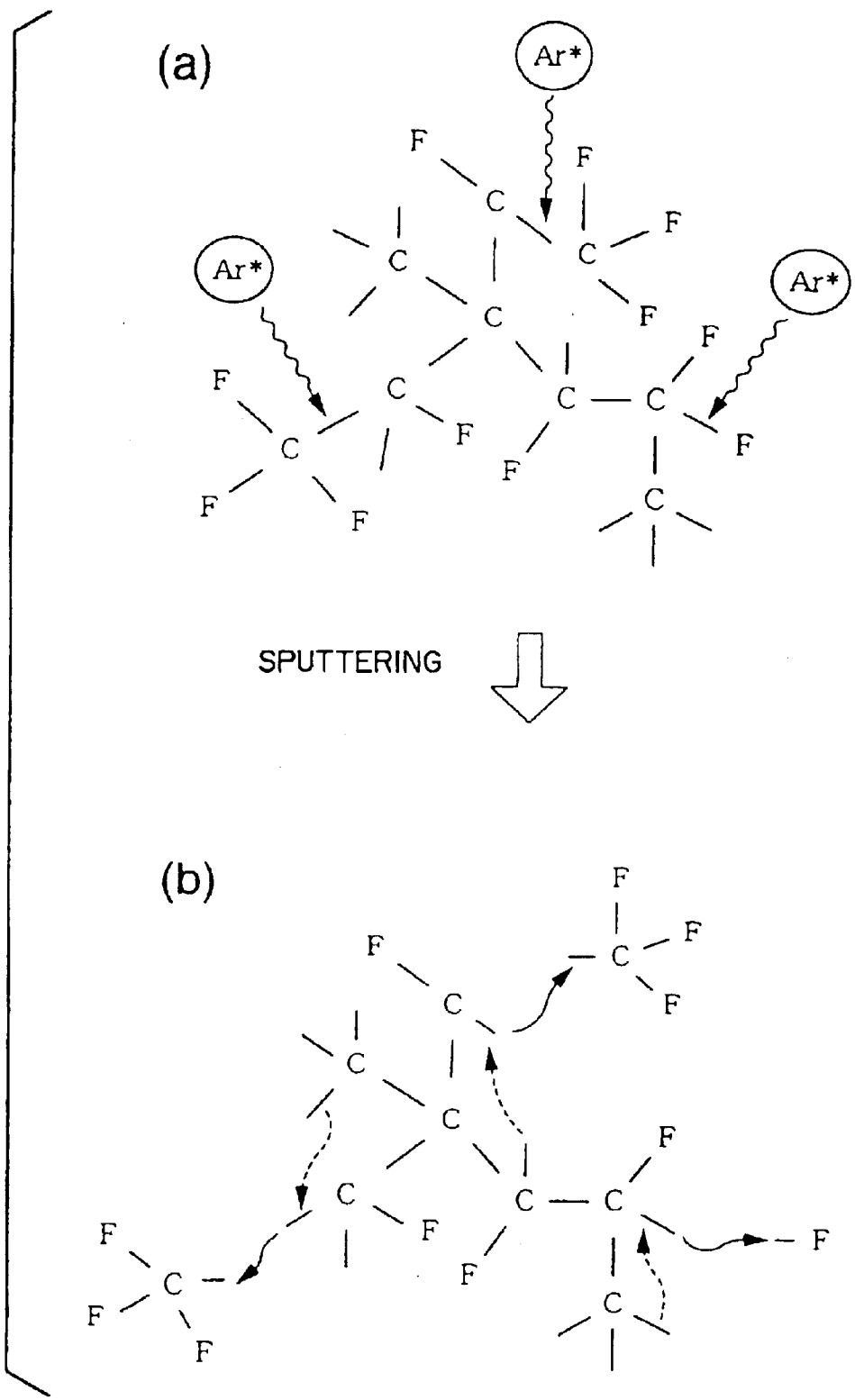
F I G. 4

PLASMA TREATMENT METHOD

This application is a continuation of International Application No. PCT/JP98/05131, filed Nov. 13, 1998, the content of which is incorporated herein by reference.

TECHNICAL FIELD

The present invention relates to a plasma treatment method for enhancing the thermostability of a fluorine containing carbon film capable of being used as, e.g., an interlayer dielectric film of a semiconductor device, and a plasma treatment method for depositing a fluorine containing carbon film having high thermostability.

BACKGROUND ART

In order to achieve the high integration of a semiconductor device, it has been developed to provide devices, such as the scale down of a pattern and the multilayering of a circuit. As one of such devices, there is a technique for multilayering wirings. In order to provide a multilevel interconnection structure, a number n wiring layer and a number (n+1) wiring layer are connected to each other by means of a conductive layer, and a thin-film called an interlayer dielectric film is formed in a region other than the conductive layer.

A typical interlayer dielectric film is an $SiO_2$ film. In recent years, in order to more accelerate the operation of a device, it has been required to reduce the relative dielectric constant of the interlayer dielectric film, and the material of the interlayer dielectric film has been studied. That is, the relative dielectric constant of an $SiO_2$ film is about 4, and it has been diligently studied to dig up materials having a smaller relative dielectric constant than that of the $SiO_2$ film. As one of such materials, it has been studied to put an SiOF film having a relative dielectric constant of 3.5 to practical use. The inventor has taken notice of a fluorine containing carbon film (which will be hereinafter referred to as a "CF film") having a still smaller relative dielectric constant. The CF film is deposited by means of, e.g., the thermal CVD (Chemical Vapor Deposition) or the plasma CVD.

Therefore, the inventor has intended to produce a CF film having high adhesion and hardness using a plasma system for producing a plasma by the electron cyclotron resonance, using gases containing, e.g., a compound gas of carbon (C) and fluorine (F) and a hydrocarbon gas, as thin-film deposition gases, on various process conditions.

However, the CF film has the following problems. FIG. 5 shows a part of a circuit part formed on a wafer, wherein reference numbers 11 and 12 denote CF films, 13 and 14 denoting conductive layers of W (tungsten), 15 denoting a conductive layer of Al (aluminum), 16 denoting an $SiO_2$ film, into which P and B have been doped, and 17 denoting an n-type semiconductor region. The W layer 13 is formed at a process temperature of 400 to 450° C. At this time, the CF films 11 and 12 are heated to the process temperature. However, if the CF films are heated to such a high temperature, a part of C—F bonds are cut, so that F gases are mainly desorbed. The F gasses include F, CF, $CF_2$ gases and so forth.

If the F gases are thus desorbed, there are the following problems.
(a) The metal wirings of aluminum, tungsten and so forth are corroded.
(b) Although the insulator film also has the function of pressing the aluminum wiring to prevent the swell of aluminum, the pressing force of the insulator film on the aluminum wiring is decreased by degassing. As a result, the aluminum wiring swells, so that an electrical defect called electromigration is easily caused.
(c) The insulator film cracks, so that the insulation performance between the wirings gets worse. When the extent of the crack increases, it is not possible to form a wiring layer at the next stage.
(d) If the amount of desorbed F increases, the relative dielectric constant increases.

DISCLOSURE OF THE INVENTION

It is therefore an object of the present invention to eliminate the aforementioned problems and to provide a plasma treatment method capable of forming an insulator film of a CF film, which has strong bonds and high thermostability, e.g., an interlayer dielectric film of a semiconductor device.

According to one aspect of the present invention, a plasma treatment method includes a step of activating a sputtering gas to form a plasma to irradiate a fluorine containing carbon film, which is formed on a substrate to be treated, with the plasma.

According to another aspect of the present invention, a plasma treatment method comprises: a thin-film deposition step of decomposing a thin-film deposition gas containing a compound gas of carbon and fluorine, to deposit a fluorine containing carbon film on a substrate to be treated, by a chemical gaseous phase reaction; and a sputtering step of activating a sputtering gas to form a plasma to irradiate the fluorine containing carbon film, which is deposited on the substrate, with the plasma, wherein the thin-film deposition step and the sputtering step are alternately repeated.

According to the present invention, it is possible to provide a CF film which has high thermostability and a small amount of desorbed F gases. Therefore, if this CF film is used as, e.g., an interlayer dielectric film of a semiconductor device, it is possible to prevent the corrosion of metal wirings, the swell of aluminum wirings and the production of cracks. Since it is required to scale semiconductor devices down and to accelerate the operation of semiconductor devices and since CF films are noticed as effective insulator films having a small relative dielectric constant, the present invention is effective in the practical use of CF films as insulator films.

BRIEF DESCRIPTION OF THE DRAWINGS

FIG. 1 is a longitudinal section of an example of a plasma treatment system for carrying out a method according to the present invention;

FIGS. 4 is a schematic diagram showing the operation of the preferred embodiment of the present invention.

BRIEF MODE FOR CARRYING OUT THE INVENTION

Figure 2:
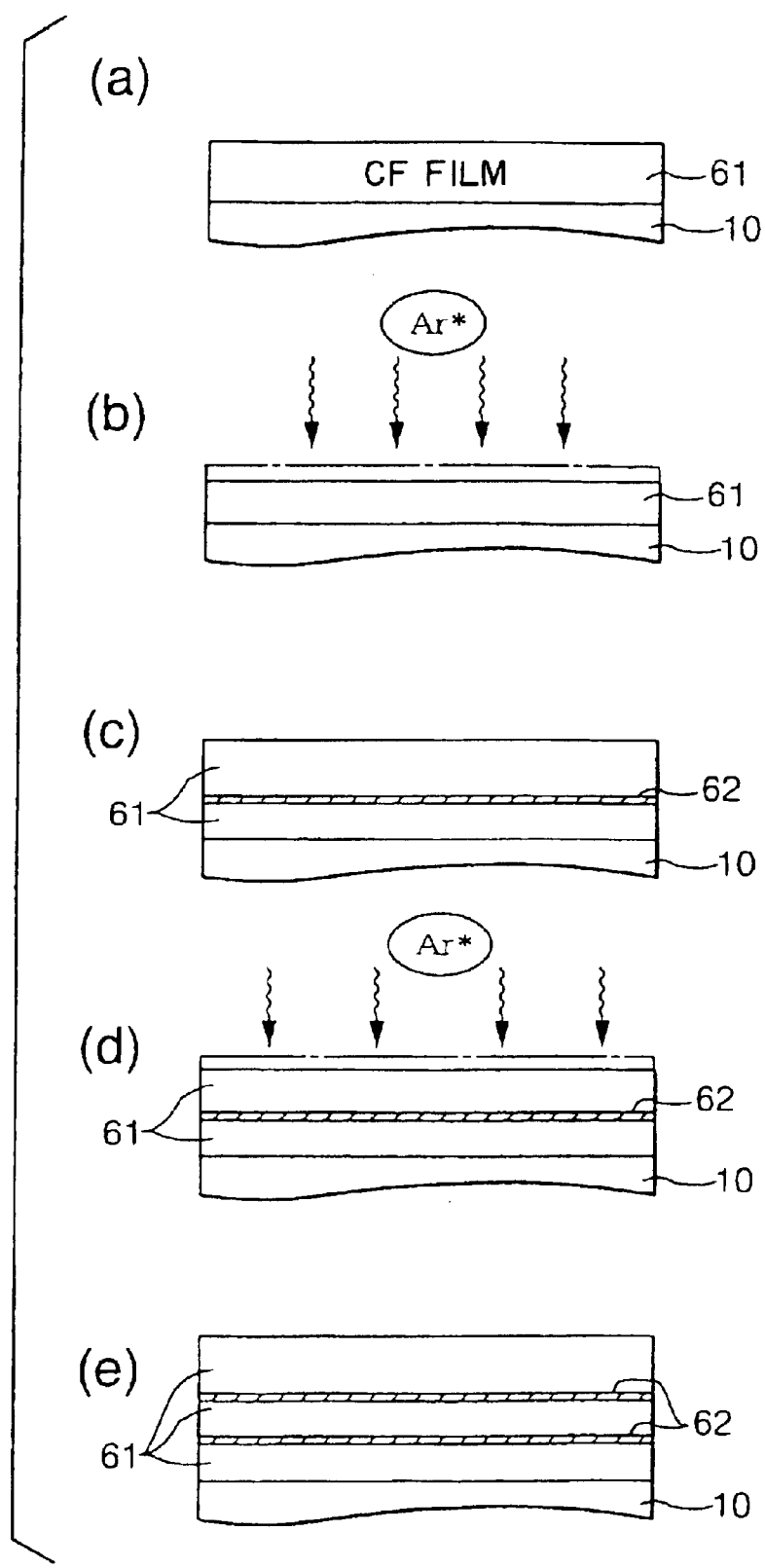
FIGS. 2 is a schematic diagram showing steps in the preferred embodiment of the present invention.

FIG. 1 shows an example of a plasma treatment system for use in the preferred embodiment of the present invention. This system has a vacuum vessel 2 of, e.g., aluminum. The vacuum vessel 2 comprises a first cylindrical vacuum chamber 21, which is arranged in an upper portion for producing a plasma, and a second cylindrical vacuum chamber 22, which is communicated with and connected to the lower portion of the first vacuum chamber 21 and which has a greater diameter than that of the first vacuum chamber 21. Furthermore, the vacuum vessel 2 is grounded to have a zero potential.

The upper end of the vacuum vessel 2 is open. A transmission window 23 of a microwave permeable material, e.g., quartz, is airtightly provided in the open upper end of the vacuum vessel 2 so as to hold vacuum in the vacuum vessel 2. Outside of the transmission window 23, there is provided a waveguide 25 connected to a high-frequency power supply part 24 for producing a microwave of, e.g., 2.45 GHz. The microwave produced by the high-frequency power supply part 24 is guided by the waveguide 25 in, e.g., a TE mode, or the microwave guided in the TE mode is converted by the waveguide 25 into a TM mode, to be introduced from the transmission window 23 into the first vacuum chamber 21.

In the side wall defining the first vacuum chamber 21, gas nozzles 31 are arranged at regular intervals along, e.g., the periphery thereof. The gas nozzles 31 are connected to a plasma producing gas source (not shown), e.g., an Ar gas source, and a hydrogen plasma producing gas source (not shown), e.g., an $H_2$ (hydrogen) gas source, so that a plasma producing gas, e.g., Ar gas or $H_2$ gas, can be uniformly supplied to the upper portion in the first vacuum chamber 21.

In the second vacuum chamber 22, a mounting table 4 for a semiconductor wafer (which will be hereinafter referred to as a "wafer") 10 is provided so as to face the first vacuum chamber 21. The mounting table 4 has an electrostatic chuck 41 on the surface thereof. The electrode of the electrostatic chuck 41 is connected to a dc power supply (not shown) for absorbing the wafer and to a high-frequency power supply part 42 for applying a bias voltage for implanting ions into the wafer.

A process for forming an interlayer dielectric film of a CF film on a wafer 10, which is a substrate to be treated, by means of the above described system will be described below. The process of the present invention is characterized that a process for depositing a CF film and a sputtering process are alternately carried out. First, a gate valve (not shown) provided in the side wall of the vacuum vessel 2 is open, and the wafer 10, on which a wiring of , e.g., aluminum, has been formed, is introduced from a load-lock chamber (not shown) by means of a transport arm (not shown) to be mounted on the mounting table 4 to be electrostatically absorbed by means of the electrostatic chuck 41, so that a CF film is deposited on the wafer 10 as shown in FIG. 2(a).

That is, after the gate valve is closed to seal the interior of the vacuum vessel 2, the internal atmosphere is exhausted by exhaust pipes 28, and the interior of the vacuum vessel 2 is evacuated to a predetermined degree of vacuum to be maintained at a predetermined process pressure. In this state, a plasma producing gas, e.g., Ar gas, is introduced from the gas nozzles 31 into the first vacuum chamber 21 at a predetermined flow rate, and a thin-film deposition gas is introduced from a thin-film deposition gas supply part 5 into the second vacuum chamber 22 at a predetermined flow rate. Then, a high-frequency wave (a microwave) of 2.45 GHZ and 2700 W is supplied from the high-frequency power supply part 24, and a bias voltage of 13.56 MHz and 1500 W is applied to the mounting table 4 from the high-frequency power supply part 42.

Thus, the microwave from the high-frequency power supply part 24 passes through the waveguide 25 to reach the ceiling of the vacuum vessel 2, and passes through the transmission window 23 to be introduced into the first vacuum chamber 21. In the vacuum vessel 2, a magnetic field extending from the upper portion of the first vacuum chamber 21 to the lower portion of the second vacuum chamber 22 is formed by a main electromagnetic coil 26 and an auxiliary electromagnetic coil 27, so that the intensity of the magnetic field is, e.g., 875 gasses in the vicinity of the lower portion of the first vacuum chamber 21. Thus, the electron cyclotron resonance is produced by the interaction between the magnetic field and the microwave, so that the Ar gas is activated as plasma and enriched. The produced plasma flows from the first vacuum chamber 21 into the second vacuum chamber 22 to activate $C_4F_8$ gas and $C_2H_4$ gas (as plasma), which have been supplied thereto, to form active species (plasma) to deposit a CF film 61 on the wafer 10.

After the thin-film deposition is thus carried out, a sputtering process is carried out as shown in FIG. 2(b). This sputtering process is carried out by sputtering the CF film 61, which has been deposited on the wafer 10, with plasma produced by activating a sputtering gas, e.g., Ar gas. That is, while the wafer 10 is put on the mounting table 4, Ar gas is introduced from the gas nozzles 31 at a predetermined flow rate to be activated under a microwave power (the high-frequency power supply part 24) of 2700 W and a bias power (the high-frequency power supply part 42) of 1500 W by the electron cyclotron resonance to produce Ar plasma, The CF film on the wafer 10 is irradiated with the Ar plasma, to produce an irradiated CF film 62.

Then, the thin-film deposition process and the sputtering process are repeated predetermined times (FIGS. 2(c) and 2(d)). Finally, e.g., the thin-film deposition process is carried out (FIG. 2(e)), and a series of processes are finished. The time for a thin-film deposition process is, e.g., about 42 seconds, and the time for a sputtering process is, e.g., about 28 seconds. The thickness of a CF film deposited by a thin-film deposition process is about 1000 angstroms. Thus, a CF film having a thickness of about 100 angstroms is formed in a thin-film deposition process, and a CF film having a thickness of about, e.g., 2 $\mu$m, is formed in all of thin-film deposition processes. Thereafter, when a device is actually produced, the CF film is etched with a predetermined pattern, and a W film is embedded in a groove portion to form a W wiring.

Figure 3:
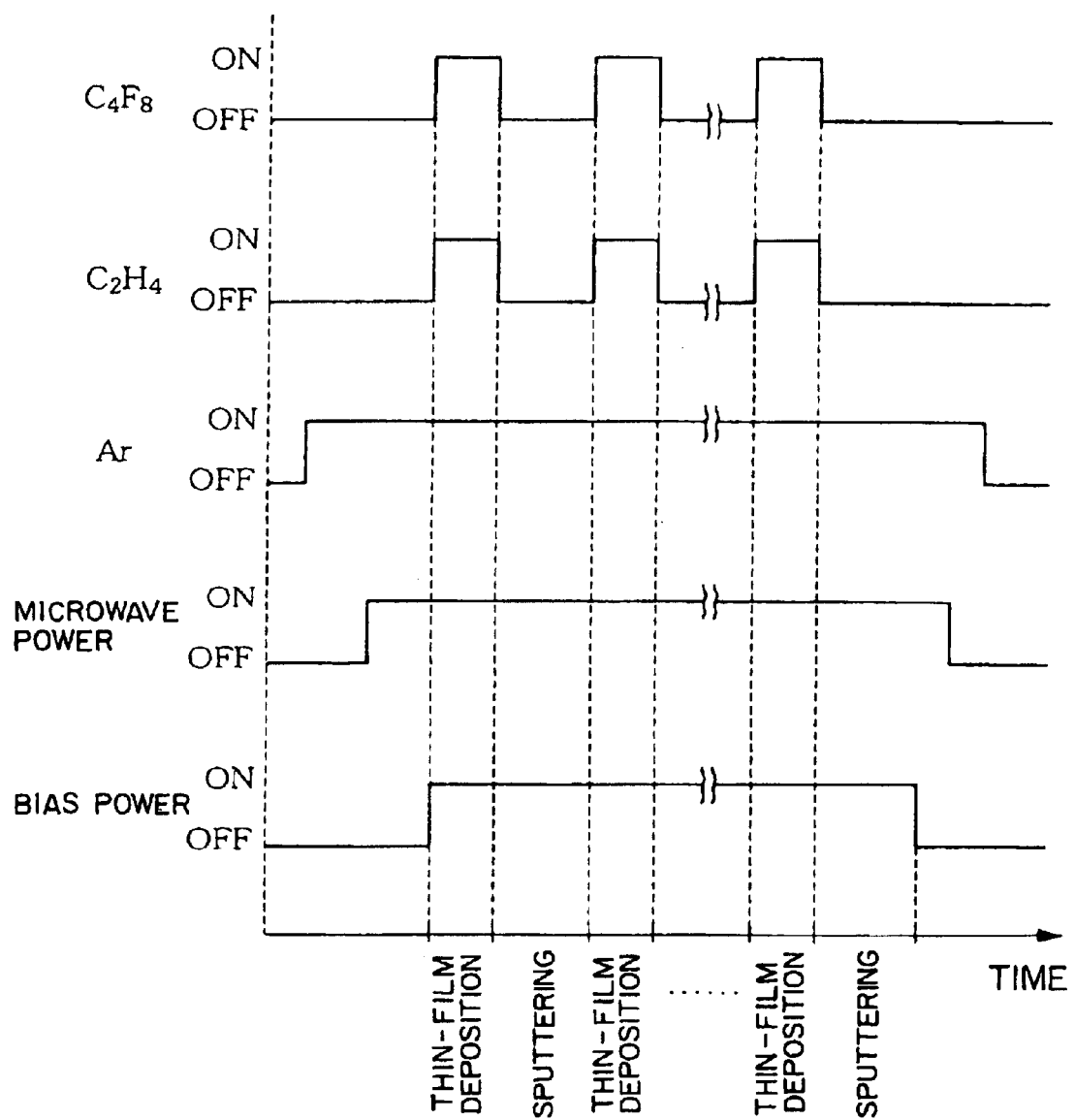
FIG. 3 is a chart showing a process sequence in the preferred embodiment.
Figure 5:
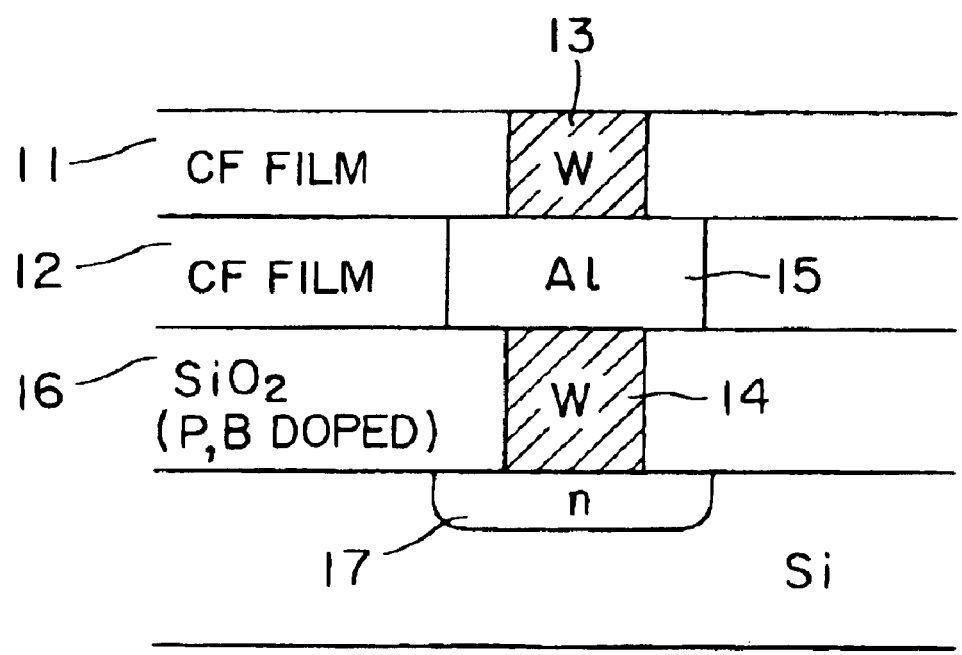
FIG. 5 is a structural drawing showing an example of the structure of a semiconductor device.

The series of processes may be finished by the thin-film deposition process as described above, or by the sputtering process. FIG. 3 shows a sequence when the series of processes are finished by the thin-film deposition process. In an actual process, after Ar gas is introduced, a microwave power is supplied. Subsequently, the introduction of a thin-film deposition gas and the supply of a bias power are simultaneously carried out to start a thin-film deposition process. Then, the introduction of the thin-film deposition gas is stopped, and a sputtering process is carried out. Thereafter, the thin-film deposition process and the sputtering process are repeated predetermined times. Then, when a sputtering process is carried out to finish a series of processes, the introduction of the thin-film deposition gas is stopped, and then, the supply of the bias power is stopped. Then, the supply of the microwave power is stopped, and finally, the introduction of Ar gas is stopped.

On the other hand, when a thin-film deposition process is finally carried out to finish a series of processes, after the introduction of a thin-film deposition gas and the supply of a bias power are stopped, the supply of a microwave power is stopped, and the introduction of Ar gas is finally stopped.

Thus, in the series of processes, a thin-film deposition process is carried out when the microwave power and the bias power are supplied and when the thin-film deposition gas and Ar gas are introduced, and a sputtering process is carried out when the introduction of the thin-film deposition gas is stopped, i.e., when the microwave power and the bias power are supplied and when Ar gas is introduced.

The CF film thus formed has a strong bond, and high thermostability as can be seen from the results of experiment which will be described later. That is, the amount of desorbed F gases is small even at a high temperature. It is considered that the reason for this is as follows. That is, if a CF gas and a hydrocarbon gas are combined as a thin film deposition gas to deposit a CF film, it is considered that the CF film includes C—C bonds, C—F bonds and so forth as shown in FIG. 4(a).

As this preferred embodiment, if the CF film is sputtered with the plasma (Ar*), the CF film is struck with Ar plasma from the surface thereof, so that the thickness of the CF film decreases. At this time, weak bonds, e.g., C—$CF_3$ bonds and C—F bonds, and CF macromolecule parts, which are formed in the CF film during the deposition of the CF film, are physically struck by sputtering, and cut $CF_3$ and F are scattered from the film. Then, C, from which $CF_3$ or F has been cut, are bonded to another C to form a new C—C bond. Thus, the C—C bonds form a three-dimensional structure, so that the bonds constituting the CF film are strengthen.

Therefore, if the thin-film deposition process and the sputtering process are alternately carried out, the film is laminated so as to has therein layers having bonds strengthen with sputtering as shown in FIG. 2 (e). In the whole CF film thus formed, the number of weak bonds is smaller than that in a CF film formed without any sputtering processes. The F gases are desorbed by the scattering of F, CF, $CF_2$ and $CF_3$, which are produced by cutting C—C bonds and C—F bonds by heat during a heat treatment at a high temperature. If the weak bonds are previously struck with sputtering to be removed, the number of bonds cut by heat decreases, so that the amount of desorbed F gases can be decreased.

Since the CF film includes some layers having strong bonds as intermediate layers, C—C bonds in the layers are difficult to be cut even at a high temperature. Therefore, even if weak bonds are cut below the layers to cause degassing, the intermediate strong film serves as a barrier to inhibit F gasses from passing therethrough. Thus, in the CF film formed by the above described process, the degassing of F gasses is inhibited even during a heat treatment at a high temperature, so that the thermostability of the CF film is improved.

Experiments, which were carried out in order to examine the thermostability of a CF film formed by the method of the present invention, will be described below. The plasma treatment system shown in FIG. 1 was used, and Ar gas, $C_4F_8$ gas and $C_2H_4$ gas were introduced at flow rates of 150 sccm, 40 sccm and 30 sccm, respectively, to carry out a thin-film deposition process for 42 seconds. At this time, the microwave power and the bias power were set to be 2700 W and 1500 W, respectively, and the process pressure was set to be 0.23 Pa. Then, Ar gas was introduced at a flow rate of 150 sccm to be activated as plasma, and a sputtering process was carried out for 28 seconds. At this time, the microwave power and the bias power were set to be 2700 W and 1500 W, respectively. The thin-film deposition process and the sputtering process were repeated twenty times. Finally, the thin-film deposition process was carried out to deposit a CF film having a thickness of about 2 μm on the wafer 10 (Example 1).

The CF film thus deposited was annealed at 425° C. for 2 hours, and the variation in weight of the CF film before and after annealing was examined by an electron force balance. This variation in weight is an index of the thermostability of a thin film. As this value is small, the amount of desorbed F gases is small, and thermostability is high.

Similarly, the variations in weight were measured when the time for the thin-film deposition process was 82 seconds, the time for the sputtering process was 28 seconds and the repeating times was 10 (Example 2), and when a CF film having a thickness of about 2 μm was deposited on the wafer 10 without any sputtering processes (Comparative Example). In Example 2 and Comparative Example, all of the conditions, such as the flow rates of Ar gas and the thin-film deposition gas, the microwave power and the bias power, were the same as those in Example 1.

The variations in weight of the CF film were 2.55% in Example 1, 3.10% in Example 2 and 3.62% in Comparative Example. It was confirmed that when the sputtering process was carried out, the variation in weight was smaller than that when no sputtering process was carried out, and the amount of desorbed F gases was decreased to enhance thermostability. Moreover, it was confirmed that even if the thickness of the deposited CF film was the same, as the repeating times of the thin-film deposition process and the sputtering process were increased, the variation in weight of the CF film was decreased to enhance thermostability.

As the thin film deposition gases, compound gases of C and F, such as $CF_4$, $C_2F_6$, and $C_3F_8$ gases, as well as gases containing C, F and H, such as $CHF_3$ gas, may be used. Also, as the thin film deposition gases, hydrocarbon gases, such as $CH_4$, $C_2H_2$, $C_2H_6$, $C_3H_8$ and $C_4H_8$ gases, may be used. Hydrogen gas may be substituted for the hydrocarbon gas.

Moreover, as the sputtering gas other than Ar gas, He, Ne, Xe, $H_2$, $NH_3$, $CF_4$, $C_2F_6$ and $C_4F_8$ gases may be used. Any one of these gases may be used alone, or the mixture of some kinds of these gases may be used. While the sputtering gas has been introduced from the gas nozzles 31 in the aforementioned preferred embodiment, it may be introduced from the thin-film deposition gas supply part 5.

In the aforementioned preferred embodiment, the process sequence shown in FIG. 3 has been used since the plasma producing gas has been used as the sputtering gas. However, in a case where a gas, such as He gas, which is different from the plasma gas, is used as the sputtering gas, when the sputtering process is carried out, the introduction of the thin-film is stopped and the sputtering gas is introduced.

Moreover, in a case where the same kind of gas as the thin-film deposition gas, such as $C_4F_8$ gas, is used as the sputtering gas, when the sputtering process is carried out, the introduction of hydrocarbon gas, which is not used as the sputtering gas, is stopped. Thus, if the same kind of gas as the thin-film gas and the plasma producing gas is used as the sputtering gas, operation is easy since it is sufficient to stop the introduction of undesired gasses when the sputtering process is carried out.

Moreover, according to the present invention, the method for depositing the CF film should not be limited to the plasma CVD, the CF film may be deposited by the thermal CVD. In addition, when the thin-film is deposited by the plasma CVD, the plasma producing method should not be limited to the ECR, the present invention may be applied to the case where plasma is produced by, e.g., a method called ICP (Inductive Coupled Plasma) for applying electric and magnetic fields to a process gas from a coil wound onto a dome-shaped container, the case where plasma is produced using a helicon wave and a magnetic field, and the case where plasma is produced by applying a high-frequency power between electrodes called parallel plates which face each other.

Moreover, according to the present invention, the process may be started from the sputtering step before the thin-film deposition step, and the repeating times of the thin-film deposition steps and the sputtering steps may be any times. The series of processes may be finished by the thin-film deposition step or the sputtering step. However, since the surface of the CF film is struck with plasma when the sputtering step is carried out, a CMP step may be carried out in another system after the sputtering step when the processes are finished by the sputtering step.

The thermostability of the CF film may be examined on the basis of the amount of degassing or the variation in film thickness measured by the TDS spectrum (Thermal Disorption Spectroscopy), or on the basis of the variation in weight measured by the TGA (Thermal Gravimetry Analysis).

What is claimed is:

1. A plasma treatment method for treating an interlayer dielectric film formed on a substrate to be treated when producing a semiconductor device having a multilevel interconnection structure, the method comprising:

activating a sputtering gas to form a plasma;

irradiating with the plasma, a previously deposited fluorine containing carbon film serving as the interlayer dielectric film; and striking a bond portion between fluorine and groups containing carbon and fluorine formed within the fluorine containing carbon film with the plasma formed by activating the sputtering gas such that the bond portion is cut, imbedding a metal wiring in the irradiated fluorine containing carbon film.

2. The plasma treatment method of claim 1, wherein the sputtering gas is: Ar, He, Ne, Xe, $H_2$, $NH_3$, $CF_4$, $C_2F_6$, $C_3F_8$, $C_4F_8$, or a mixture thereof.

3. A plasma treatment method for treating an interlayer dielectric film according to claim 1, wherein said bond portion is a bond formed between C and C or C and F.

4. A plasma treatment method for treating an interlayer dielectric film, which is formed when producing a semiconductor device having a multilevel interconnection structure, with a plasma, said method comprising:

a thin-film deposition step of introducing a thin-film deposition gas, which serves to form a fluorine containing carbon film serving as said interlayer dielectric film, and activating said thin-film deposition gas to form a thin-film deposition gas plasma to form said fluorine containing carbon film;

a sputtering step of introducing a sputtering gas to form a sputtering gas plasma after stopping the introduction of said thin-film deposition gas, and irradiating said fluorine containing carbon film, which is formed on a substrate to be treated, with said sputtering gas plasma to strike a bond portion between fluorine and groups containing carbon and fluorine formed within the fluorine containing carbon film such that the bond portion is cut, wherein the thin-film deposition step and the sputtering step are repeated one or more times to form the interlayer dielectric film, such that the interlayer dielectric film consists essentially of irradiated fluorine containing carbon film; and imbedding a metal wiring in the irradiated fluorine containing carbon film.

5. The plasma treatment method of claim 4, wherein the sputtering gas is: Ar, He, Ne, Xe, $H_2$, $NH_3$, $CF_4$, $C_2F_6$, $C_3F_8$, $C_4F_8$, or a mixture thereof.

6. The plasma treatment method of claim 4, wherein the introducing of the thin-film deposition gas, and the introducing of the sputtering gas are alternately repeated.

7. The plasma treatment method of claim 4, wherein a chemical polishing step is carried out after the introducing of the sputtering gas is finished.

8. A plasma treatment method for treating an interlayer dielectric film formed on a substrate to be treated when producing a semiconductor device having a multilevel interconnection structure, the method comprising:

introducing a mixed gas composed of a plasma producing gas and a thin-film deposition gas, and activating the mixed gas to form a sputtering gas plasma to form a fluorine containing carbon film serving as the interlayer dielectric film;

selecting a sputtering gas from the mixed gas, stopping the introducing of gases in the mixed gas other than the sputtering gas, and sputtering the fluorine containing carbon film formed on the substrate to be treated with the sputtering gas plasma;

striking a bond portion between fluorine and groups containing carbon and fluorine formed within the fluorine containing carbon film with the sputtering gas plasma such that the bond portion is cut, wherein the activating, stopping, and striking steps are repeated one or more times to form the interlayer dielectric film, such that the interlayer dielectric film consists essentially of an irradiated fluorine containing carbon film; and imbedding a metal wiring in the irradiated fluorine containing carbon film.

9. The plasma treatment method of claim 8, wherein the sputtering gas is: Ar, Ne or Xe; and the gases in the mixed gas other than the sputtering gas are: $C_2F_6$, $C_3F_8$, or $CHF_3$.

10. The plasma treatment method of claim 8, wherein the sputtering gas is: $CF_4$, $C_2F_6$, $C_3F_8$, or $CHF_3$; and the gases in the mixed gas other than the sputtering gas are: $CH_4$, $C_2H_2$, $C_2H_6$, $C_3H_8$, or $C_4H_8$.

11. The plasma treatment method of claim 8, wherein the introducing of the mixed gas and the selecting of a sputtering gas are alternately repeated.

12. The plasma treatment method of claim 8, wherein chemical polishing is carried out after the selecting of the sputtering gas is finished.

13. A plasma treatment method for treating an interlayer dielectric film according to claim 8, wherein said bond portion is a bond formed between C and C or C and F.

* * * * *